United States Patent [19]

Oldham

[11] Patent Number: 4,965,509
[45] Date of Patent: Oct. 23, 1990

[54] QUASI-CONSTANT GATE DRIVE CIRCUIT

[75] Inventor: David J. Oldham, Allentown, Pa.

[73] Assignee: Lutron Electronics Co., Inc., Coopersburg, Pa.

[21] Appl. No.: 310,806

[22] Filed: Feb. 13, 1989

[51] Int. Cl.$^5$ .............................................. G05F 5/02
[52] U.S. Cl. .................................... 323/300; 323/320; 323/905; 315/194; 315/DIG. 4
[58] Field of Search ............... 323/237, 239, 300, 320, 323/324, 325, 905; 315/DIG. 4, DIG. 5, DIG. 7, 199, 225, 226, 276, 194; 307/252 B, 252 C, 252 N, 252 UA

[56] References Cited

U.S. PATENT DOCUMENTS

| | | | |
|---|---|---|---|
| 3,500,455 | 3/1970 | Ross et al. | 323/905 X |
| 3,935,505 | 1/1976 | Spiteri | 323/905 X |
| 4,160,192 | 7/1979 | McAllise | 315/DIG. 4 X |
| 4,449,054 | 5/1984 | Jop | 323/324 X |
| 4,876,498 | 10/1989 | Luchaco et al. | 323/300 |

FOREIGN PATENT DOCUMENTS 1327958  8/1973  United Kingdom .
2187899  9/1987  United Kingdom .

OTHER PUBLICATIONS

General Electric Silicon Controlled Rectifier Manual, third ed., p. 69, Lutron Electronics Co., Inc.–Ampion Brochure–P/N 360-219, Jun. 1988.

Primary Examiner—Mark O. Budd
Assistant Examiner—Emanuel Todd Voeltz

[57] ABSTRACT

A two-wire apparatus for controlling AC power to a load, by turning a thyristor on and off during each half cycle, includes a circuit that prevents the thyristor from being turned off prematurely. The circuit stores energy while the thyristor is off (i.e., non-conductive). After the thyristor turns on, the stored energy flows to the gate of the thyristor to keep it on until the end of the half cycle. The circuit permits reduced electromagnetic interference and increased load power rating; without requiring a third (neutral) wire for the apparatus.

41 Claims, 5 Drawing Sheets

QUASI-CONSTANT GATE DRIVE CIRCUIT

BACKGROUND OF THE INVENTION

1. Field of the Invention

The present invention relates to controlling power to a lighting load using solid state dimming technology.

2. Description of the Related Art

Continuous dimming of lighting is desirable for a number of reasons. It can change the atmosphere of a room or compensate for illuminance losses caused by lamp lumen depreciation, dirt effects, and other light loss factors. It is also desirable to adjust the illumination in response to varying natural light conditions.

Many types of control systems are known for continuous dimming of lighting. Phase control dimming, a commonly used system, generally employs a controllably conductive device (i.e., a solid state switch) to interrupt the flow of power to a load during a portion of each half cycle. Although gate turn off devices and bipolar and MOSFET transistors have found limited use in phase control systems, thyristors or, more specifically, triacs are preferred. In what follows, we will assume that a triac is being used as the solid state switch.

A triac normally has three terminals—a cathode, an anode, and a gate (or control terminal). Current may be injected into or drawn out of the gate to cause the triac to fire (i.e., switch from a non-conductive state to a conductive state). Once fired, a triac remains conductive, even in the absence of gate current, until the conducted current drops below a certain level known as the holding current, which is generally about 1/1000 of its maximum current rating. Below this holding current, the triac reverts back to its non-conductive state. A phase control system operates by firing the triac after a time (or "phase") delay after each zero crossing of power flow from the AC source. During the phase delay, the triac is nonconductive, and no current flows to the load. Once the triac is fired, current flows to the load until the next zero crossing. By varying the delay, one controls the average power provided to a load—the greater the delay, the lower the power to the load.

The phase delay is typically varied with an adjustable time delay circuit (more commonly referred to as a "firing circuit"), consisting of a series-connected resistor and capacitor, and a suitable breakover device, such as a diac, connected between the gate of a triac and the capacitor. Voltage applied across the resistor and capacitor forces current to flow through the resistor, charging the capacitor according to a time constant determined by the product of the resistance and capacitance. After a certain predictable time delay following each zero crossing, the capacitor voltage reaches a predetermined value and the diac breaks over. The capacitor discharges into the triac gate and fires the triac. The time delay can be varied by adjusting the resistance or capacitance.

One problem commonly encountered with phase control systems is the emission of electro-magnetic interference (EMI). For a given power, the strength and frequency of the EMI is related to the switching time. Slow switching results in weak, low frequency EMI. Triacs switch very rapidly, and, as a result, produce strong, high frequency EMI.

EMI can be divided into two types of emissions, conducted emissions and radiated emissions. Conducted emissions use the power line itself as a path for propagation. Generally, this emission is limited to that branch of the circuit to which the emitting device is connected, and is of concern only to the extent that it may interfere with other devices on that same branch.

Radiated emission refers to the electromagnetic energy emitted into the air. Radiated emissions can induce unwanted voltages in nearby circuits, such as a radio or television, causing annoying disruption or even malfunction. The primary radiating antenna in the case of a phase control system used to control power to a lamp is generally the wiring.

In most countries, there are EMI emission standards and limits that electrical equipment manufacturers must adhere to. In the U.S., The Federal Communications Commission (FCC) broadly regulates such equipment (FCC, Part 15 or 18), and the Food and Drug Administration (FDA) issues separate standards for devices used in hospitals.

There are basically two modes of attack for reducing EMI emission. The circuit may be redesigned to eliminate rapid switching or, more commonly, when rapid switching cannot be eliminated, a filter may be used to attenuate specific unwanted components (usually the higher frequencies). The first alternative is difficult or, more often, impossible to do. The second alternative, designing a filter, is in principle a ralatively simple exercise. However, implementing a satisfactory design requires much iteration, because success depends not only upon the calculated impedances, but upon the characteristics of each individual component. These include core losses, saturation, magnetostriction, and impedance variation with frequency.

Another unavoidable problem is that capacitors have self-inductance and inductors have self-capacitance; both, therefore, are self-resonant. Often, the self-resonant frequencies of filter circuit components, or component assemblies, are near enough to the strongest EMI frequency that the filters so created do not significantly attenuate, and may even enhance, unwanted high frequency components. In some instances, even lower frequencies may not be attenuated. Furthermore, components that are adequate for filtering EMI may dissipate excessive heat, or produce unacceptable levels of audible noise. Beyond this, the geometries of the filter layout and control system and the interaction between the two can be critical to successful EMI reduction, and the difficulties escalate rapidly as power increases.

SUMMARY OF THE INVENTION

In accordance with the present invention, an apparatus for controlling power flow from an AC source to a load comprises, in combination:

(a) a thyristor, having a conductive and substantially non-conductive state, (b) means for switching said thyristor to said conductive state during each half cycle of power flow from said AC source, (c) means for storing energy while said thyristor is in said non-conductive state, and (d) means for supplying said stored energy to a control terminal of said thyristor while said thyristor is in said conductive state to maintain said thyristor in said conductive state until the completion of each half cycle.

In another embodiment of the present invention, an apparatus for controlling power flow from an AC source to a load comprises, in combination:

(a) a thyristor having a conductive and substantially non-conductive state, and (b) a circuit for storing energy while said thyristor is in said non-conductive state and supplying an oscillating current to a control terminal of said thyristor while said thyristor is in said conductive state to maintain said thyristor in said conductive state until the completion of each half cycle of power flow from said AC source.

In another embodiment of the present invention, an apparatus for controlling power flow from an AC source to a load comprises, in combination:

(a) a first thyristor having a conductive and substantially non-conductive state, (b) a second thyristor having a conductive and substantially non-conductive state for controlling energy supplied to a control terminal of said first thyristor, (c) means for switching said second thyristor to said conductive state during each half cycle of power flow from said AC source, and (d) an oscillating circuit for supplying energy through said second thyristor to said control terminal of said first thyristor to maintain said first thyristor in said conductive state until the completion of each half cycle.

In another embodiment of the present invention, an apparatus for controlling power from an AC source to a load comprises, in combination:

(a) a first thyristor, having a conductive and substantially non-conductive state, (b) an oscillating circuit comprising an inductor and a capacitor; and (c) switching means for connecting said oscillating circuit to a control terminal of said first thyristor for providing current to said control terminal to maintain said first thyristor in said conductive state until the completion of each half cycle of power flow from said AC source.

In another embodiment of the present invention, an apparatus for controlling power flow from an AC source to a load comprises, in combination:

(a) a first triac, comprising a gate, an anode, and a cathode, said first triac anode electrically connectable to said ac power source and said first triac cathode electrically connectable to a load through a first inductor;

(b) a second triac, comprising a gate, an anode, and a cathode, said second triac anode electrically connected to said first triac anode through a first resistor and said second triac cathode electrically connected to said first triac gate;

(c) an oscillating circuit, comprising a second inductor and a first capacitor, electrically connected to said second triac anode and said first triac cathode;

(d) a switching circuit, comprising a second resistor electrically connected to a second capacitor, a remaining terminal of said second resistor electrically connected to said first traic anode, a remaining terminal of said second capacitor electrically connected to said first triac cathode, and a diac electrically connected to said second capacitor and said second triac gate; and (e) an output filter, comprising said first inductor electrically connected in series with said first triac and a third capacitor electrically connected in parallel with said first inductor and said first triac.

BRIEF DESCRIPTION OF THE DRAWINGS

FIGS. 2(a-c) show a phase control waveform, an LC ringing current, and a resultant combination waveform.

DETAILED DESCRIPTION OF THE INVENTION

Figure 1:
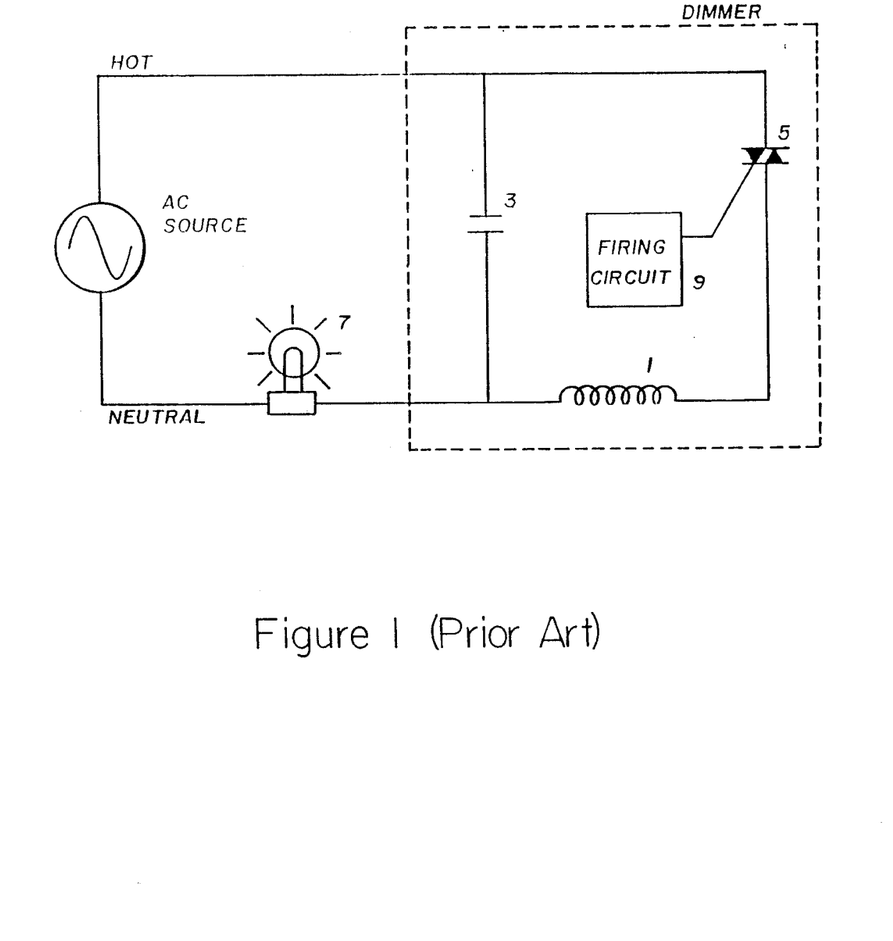
FIG. 1 is a simplified schematic of a prior art incandescent lamp dimmer containing a high frequency EMI filter.

The interaction between a high frequency EMI filter and a phase control system typically results in unintentional changes in the conductivity of the triac (self commutation). FIG. 1 depicts a prior art incandescent dimmer circuit (elements within the dashed line), including a high frequency EMI filter consisting of inductor 1 and capacitor 3. In operation, when triac 5 is non-conductive, charge is stored in capacitor 3. When firing circuit 9 fires triac 5, current begins flowing to load 7, and capacitor 3 discharges through inductor 1, initiating oscillation between the two filter elements 3 and 1. Although power dissipation in load 7 tends to dampen this oscillation, high resistance loads (low wattage) or inductive loads may allow the filter to oscillate with very little damping. The resulting interference with the triac causes self commutation, as shown in FIG. 2.

Figure 2A:
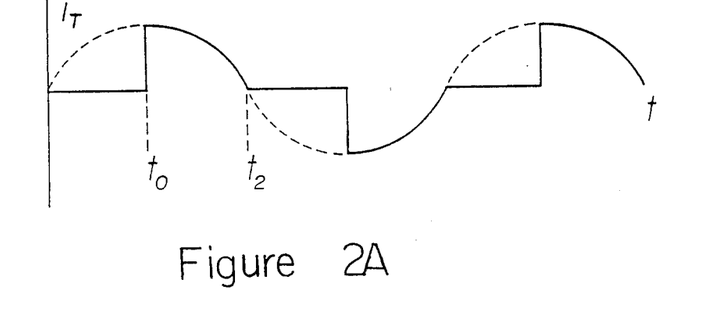
Figure 2B:
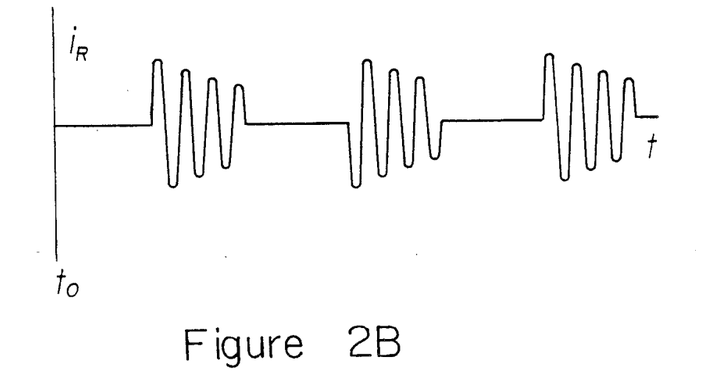
Figure 2C:
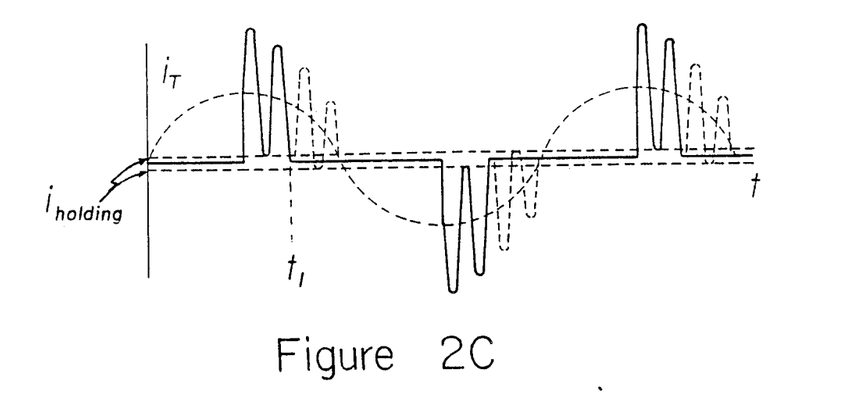

FIG. 2A shows a conventional (unfiltered) phase control waveform. The current $i_T$, through the triac is zero until $t_o$, when the triac becomes conducting, and agaig goes to zero at the next zero crossing, $t_2$. FIG. 2B depicts the ringing current, $i_R$, in an underdamped LC filter in response to the phase control waveform of FIG. 2A. For illustrative purposes, the ringing frequency shown is much lower than the actual ringing frequency. The two currents are superimposed in FIG. 2C to illustrate the resultant current through the triac. When the resultant current through the triac drops below the holding current at $t_1$, the triac shuts off, producing unpredictable variations in power delivered to the load.

One way to reduce the occurrence of self cummutation is to use special triacs with low holding currents. However, that is an expensive solution, made more difficult by the fact that holding current for forward and reverse directions of current flow through a triac are generally not the same.

Prior art circuits have included a damping resistor in series with the filter capacitor in the LC low pass filter of FIG. 1. The resistor is selected to provide a decay rate that prevents the peak ringing current from becoming negatively greater than the load current during the remainder of the half cycle, thus precluding the possibility of self commutation. However, adding a damping resistor to the filter causes substantial heat dissipation and reduces its EMI suppression effectiveness, thus degrading the performance of the dimmer. Some EMI suppression could be recovered by increasing the inductance or capacitance of the filter elements, but this generally requires larger components which may not fit in the limited space available.

Figure 3:
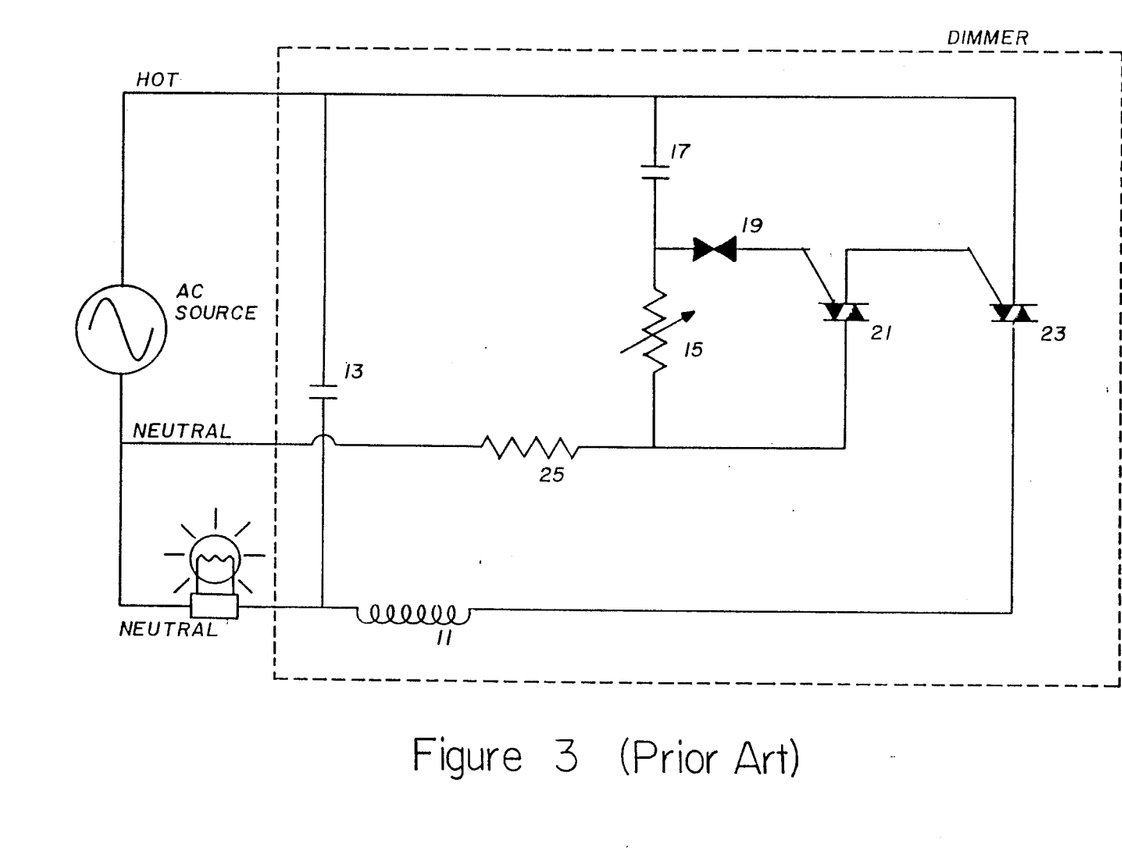
FIG. 3 is a circuit schematic of a prior art low voltage incandescent lamp dimming system.

Another prior art approach to the problem of self communtation is embodied in the circuit diagram of FIG. 3. Elements 11 and 13 comprise a low pass LC filter. Resistor 15, capacitor 17 and diac 19 comprise a firing circuit, for firing polot triac 21 and main triac 23. This three-wire dimming circuit thwarts self commutation by providing continous gate drive to the main triac 23 after it is fired in each half cycle. Current is driven to the gate by the potential between hot and neutral and is limited by resistor 25. In this manner, the main triac 23 remains conductive through the completion of the half cycle, whether or not the magnitude of the conducted current through the triac is greater than the holding current. The pilot triac 21 turns off at the end of the half cycle, when there is no potential between hot and neutral to hold it on and main triac 23 turns off when the conducted current through the main triac drops below the holding current.

As an alternative to providing continuous gate drive to thwart self commutation, a similar three-wire approach is a transistor blocking oscillator trigger circuit (see *General Electric Silicon Controlled Rectifier Manual,* 3rd ed., 1964, p. 69). That trigger circuit provides to the control terminal of a thyristor periodic bursts of current at a frequency high enough to maintain its conductivity.

However, in some instances, a neutral wire is not available in the wallbox where the dimmer is to be installed. Furthermore, running a third wire to the wallbox is undesirable due to increased installation costs.

The present invention prevents self commutation in a two-wire (without a neutral) dimmner by storing energy during the phase delay, while the triac is non-conducting, and supplying current to the gate of the triac for a predetermined peroid of time after it has been fired to maintain its conductivity for the remainder of the half cycle.

Energy can be stored in a number of ways, including a battery, an inductor, or a capacitor. A capacitor is preferred. Once stored, the energy can be supplied over a period of time to the gate of the triac by using a regulating device. The regulating device can simply be a resistor, but resistors dissipate energy, which is undesirable. Although firing circuits typically include storage capacitors, the stored energy is used to fire the triac, and substantially no current is provided to the triac gate after it has been fired. A firing capacitor could, in principle, provide energy both to fire the triac and to maintain its conductivity through the end of the half cycle; however, this may cause unpredictable phase delay variations, and is therefore not preferred.

Figure 4:
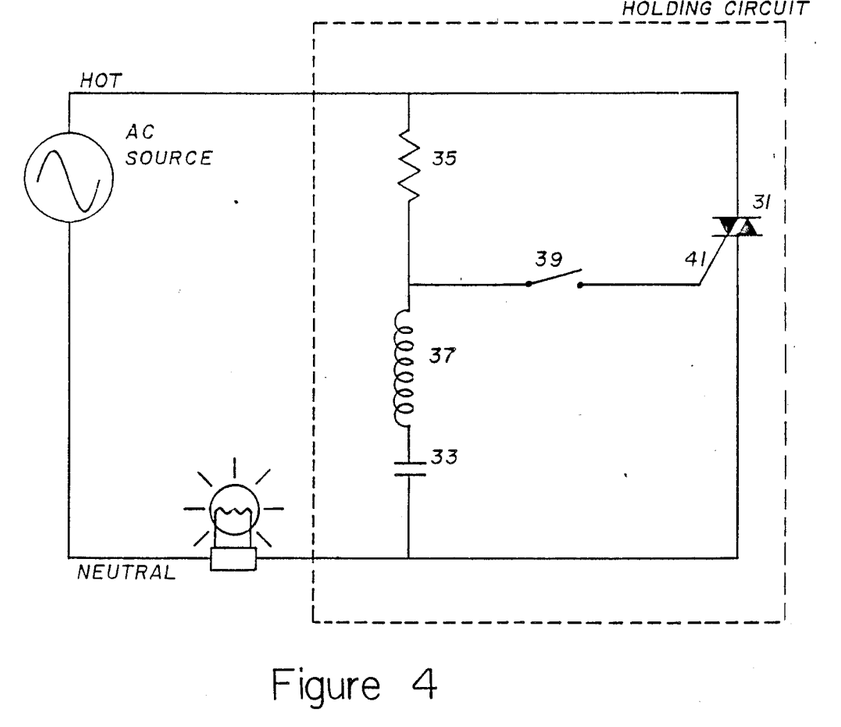
FIG. 4 is a simplified schematic of a holding circuit of the present invention.

FIG. 4 is a simplified schematic of a circuit of the present invention. It operates as follows: at the beginning of a half cycle, triac 31 is non-conducting and capacitor 33 is uncharged. Capacitor 33 begins charging through resistor 35 and inductor 37. When switch 39 is closed, current flows through resistor 35 to gate 41, firing the triac, and capacitor 33 begins to discharge through inductor 37, injecting more current into gate 41. Elements 33 and 37 constitute a low-loss oscillating circuit, which rapidly transfers energy between capacitor 33 and inductor 37 through gate 41. The oscillating current maintains the conductivity of the traic even when the conducted current is less than the holding current. Preferably, resistor 3 critically damps inductor 5 and capacitor 7, preventing oscillation while switch 9 is open. Alternatively, overdamping is acceptable. With switch 39 closed, resistor 35 is shorted out of the oscillating circuit. Switch 39 may be a thyristor and is preferably a second triac.

Figure 5:
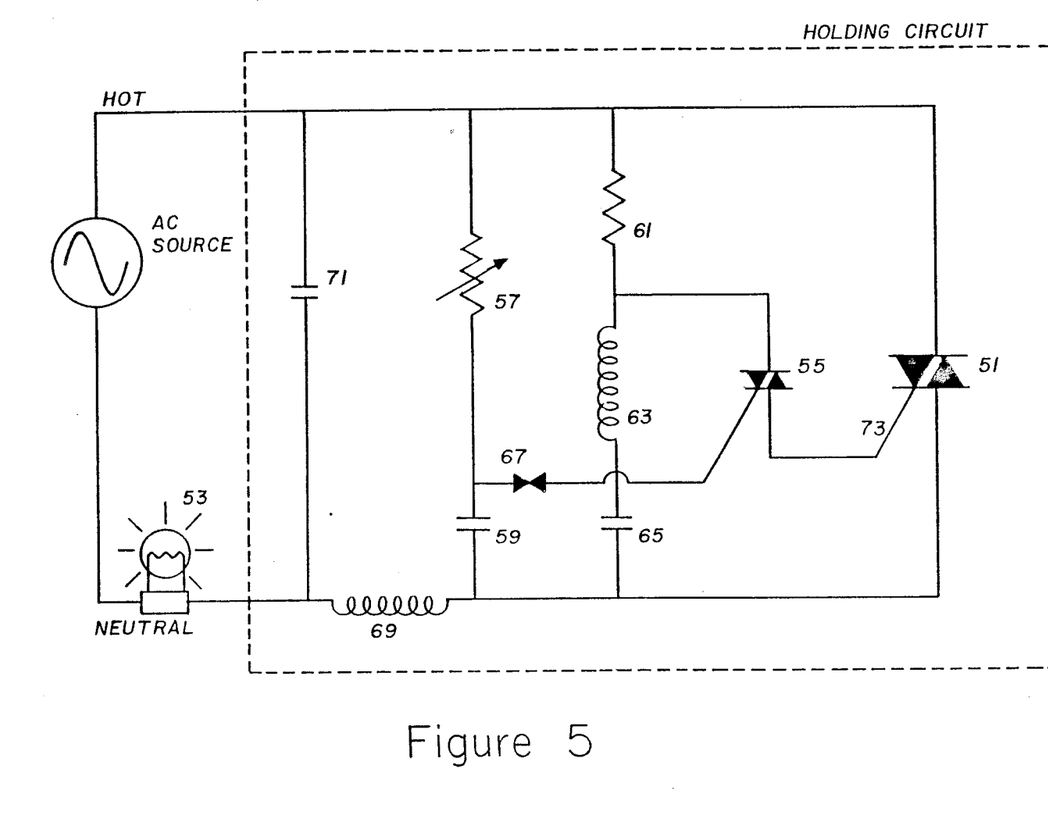
FIG. 5 is a schematic of a preferred embodiment of a holding circuit of the present invention.

FIG. 5 is a schematic drawing of a phase control circuit, including a preferred embodiment of the holding circuit of the present invention. Thiac 51 is the main switching device and controls power to the load 53. The circuit operates as follows: at the beginning of a half cycle, pilot triac 55 and main triac 51 are both non-conducting. As the half cycle progresses, current flows through timing resistor 57 and begins charging firing capacitor 59. Current also flows through resistor 61 and inductor 63 to charge capacitor 65. When the voltage across firing capacitor 59 reaches the breakover voltage of diac 67, energy stored in the firing capacitor discharges through diac 67 into the gates of pilot triac 55 and main triac 51, firing both of them.

When the main triac 51 becomes conductive, current begins to flow through output filter inductor 69 to load 53. Output filter capacitor 71 discharges through main triac 51, transferring energy to inductor 69, and initiating ringing between inductor 69 and capacitor 71. If this ringing is not damped by a low-resistance load, it can force the current conducted through main triac 51 below its holding current, as previously shown in FIG. 2.

When pilot triac 55 becomes conductive, capacitor 65 discharges through inductor 63, injecting current into gate 73 of main triac 51. Inductor 63 and capacitor 65 begin to reciprocally transfer energy at a high frequency through the pilot triac 55 and gate 73, thus maintaining the main triac 51 in a conductive state, even if the conducted current drops below the holding current before the end of the half cycle. The amplitude of this oscillation decays over time due to resistance in the oscillating circuit, mainly the resistance of main triac 51 and pilot triac 55.

Preferably, the decay time constant of the oscillating current to gate 73, is long enough to maintain the conductivity of main triac 51, even when the filter ringing causes insufficient current flow through the triac. However, the decay time constant must be short enough to allow main triac 51 to resume its non-conductive state at the next zero crossing. The decay time constant of the oscillating circuit is preferably between 10 $\mu$s and 1000 $\mu$s.

The frequency of the oscillating current, as determined by the LC product of elements 63 and 65, is preferably relatively low, to limit energy losses in the oscillating circuit and to maximize the energy which can be stored in capacitor 65. However, the time during which the oscillating current through pilot triac 55 is below the pilot triac's holding current must be shorter than the recombination time of the triac (i.e., the time required to switch from a conductive to a non-conductive state) in order to maintain its conductivity. For typical triacs, a compromise between these two criteria yields a preferred oscillating frequency range between 20 kHz and 100 kHz.

The holding circuit of the present invention alleviates the problem of self commutation in a two-wire dimmer. This makes the design of filters less complicated, resulting in improved EMI suppression. It also allows the use of inexpensive or smalle filter components or the use of audibly quieter components, which would otherwise be inadequate in suppressing EMI. Alternatively, the invention may allow an increase in the power rating of a two wire dimmer without increasing the level of EMI produced.

Although the present invention has been described in connection with preferred embodiments thereof, many variations and modifications will now become apparent to those skilled in the art. It is preferred therefore, that the present invention be limited not by the specific disclosure herein, but only by the appended claims.

We claim:

1. An apparatus for controlling power flow an AC source to a load comprising, in combination:

(a) a thyristor, having a conductive and substantially non-conductive state,
(b) means for switching said thyristor to said conductive state during each half cycle of power flow from said AC source,
(c) means for storing energy while said thyristor is in said non-conductive state, and
(d) means for supplying said stored energy to a control terminal of said thyristor while said thyristor is in said conductive state to maintain said thyristor in said conductive state until the completion of each half cycle.

2. The apparatus of claim 1 wherein said thyristor comprises a triac.

3. The apparatus of claim 1 wherein said switching means comprises a firing circuit.

4. The apparatus of claim 3 wherein said firing circuit comprises a series connected resistor and capacitor and a breakover device electrically connected to said capacitor and said control terminal.

5. The apparatus of claim 4 wherein said breakover device comprises a diac.

6. The apparatus of claim 1 wherein said energy storage means comprises a capacitor.

7. The apparatus of claim 1 wherein said energy storage means comprises an inductor.

8. The apparatus of claim 1 wherein said energy storage means comprises a battery.

9. The apparatus of claim 1 wherein said supply means comprises a resistor electrically connected to said energy storage means and said control terminal.

10. The apparatus of claim 1 wherein said supply means and said energy storage means comprise an oscillating circuit.

11. The apparatus of claim 10 wherein said oscillating circuit comprises an inductor and a capacitor.

12. An apparatus for controlling power flow from an AC source to a load comprising, in combination:
(a) a thyristor having a conductive and substantially non-conductive state, and
(b) a circuit for storing energy while said thyristor is in said non-conductive state and supplying an oscillating current to a control terminal of said thyristor while said thyristor is in said conductive state to maintain said thyristor in said conductive state until the completion of each half cycle of power flow from and AC source.

13. The apparatus of claim 12 wherein said thyristor comprises a triac.

14. The apparatus of claim 12 wherein the oscillating frequency of said current is betwen about 10 kHz and 100 kHz.

15. The apparatus of claim 12 wherein said circuit comprises a capacitor for storing energy while said controllably conductive device is in said non-conductive state.

16. The apparatus of claim 12 wherein said circuit comprises an inductor for storing energy while said controllably conductive device is in said non-conductive state.

17. The apparatus of claim 12 wherein said ciruit comprises a capacitor and an inductor.

18. The apparatus of claim 17 further comprising a resistor electrically connected to said circuit when said thyristor is in said non-conductive state.

19. The apparatus of claim 12 wherein said oscillating current has a decay time between about 10 $\mu$s and 1000 $\mu$s.

20. An apparatus for controlling power flow from an AC source to a load comprising, in combination:
(a) a first thyristor having a conductive and substantially non-conductive state,
(b) a second thyristor having a conductive and substantially non-conductive state for controlling energy supplied to a control terminal of said first thyristor,
(c) means for switching said second thyristor to said conductive state during each half cycle of power flow from said AC source, and
(d) an oscillating circuit for supplying energy through said second thyristor to said control terminal of said first thyristor to maintain said first thyristor in said conductive state until the completion of each half cycle.

21. The apparatus of claim 20 wherein said first thyristor comprises a triac.

22. The apparatus of claim 20 wherein said second thyristor comprises a triac.

23. The apparatus of claim 20 wherein said switching means comprises a firing circuit.

24. The apparatus of claim 23 wherein said firing circuit comprises a series connected resistor and capacitor and a breakover device electrically connected to said capacitor and a control terminal of said second thyristor.

25. The apparatus of claim 24 wherein said breakover device comprises a diac.

26. The apparatus of claim 20 wherein said oscillating circuit comprises an inductor and a capacitor.

27. The apparatus of claim 20 wherein the oscillating frequency of said oscillating circuit is between about 10 kHz and 100 kHz.

28. The apparatus of claim 26 further comprising a resistor electrically connected to said oscillating circuit when said first thyristor is in said non-conductive state.

29. The apparatus of claim 28 wherein said resistor critically damps said oscillating circuit.

30. The apparatus of claim 28 wherein said resistor overdamps said oscillating circuit.

31. The apparatus of claim 20 wherein said oscillating circuit has a decay time constant between about 10 $\mu$s and 1000 $\mu$s.

32. An apparatus for controlling power from an AC source to a load comprising, in combination:
(a) a first thyristor, having a conductive and substantially non-conductive state,
(b) an oscillating circuit comprising an inductor and a capacitor; and
(c) switching means for connecting said oscillating circuit to a control terminal of said first thyristor for providing current to said control terminal to maintain said first thyristor in said conductive state until the completion of each half cycle of power flow from said AC source.

33. The apparatus of claim 32 wherein said switching means comprises a firing cirucit.

34. The apparatus of claim 32 wherein the resonant frequency of said oscillating circuit is between about 10 kHz and 100 kHz.

35. The apparatus of claim 32 further comprising a resistor electrically connected to said oscillating circuit when said first thyristor is in said non-conductive state.

36. The apparatus of claim 35 wherein said resistor critically damps said oscillating circuit.

37. The apparatus of claim 35 wherein said resistor overdamps said oscillating circuit.

38. The apparatus of claim 32 wherein said oscillating circuit has a decay time constant between about 10 µs and 1000 µs.

39. The apparatus of claim 32 wherein said switching means comprises a second thyristor connected to said control terminal of said first thyristor and to said oscillating circuit.

40. The apparatus of claim 39 wherein said second thyristor comprises a triac.

41. An apparatus for controlling power flow from an AC source to a load comprising, in combination:
  (a) a first triac, comprising a gate, an anode, and a cathode, said first triac anode electrically connectable to said ac power source and said first triac cathode electrically connectable to a load through a first inductor;
  (b) a second traic, comprising a gate, an anode, and a cathode, said second triac anode electrically connected to said first triac anode through a first resistor and said second triac cathode electrically connected to said first triac gate;
  (c) an oscillating circuit, comprising a second inductor and a first capacitor, electrically connected to said second triac anode and said first triac cathode;
  (d) a switching circuit, comprising a second resistor electrically connected to a second capacitor, a remaining terminal of said second resistor electrically connected to said first triac anode, a remaining terminal of said second capacitor electrically connected to said first triac cathode, and a diac electrically connected to said second capacitor and said second triac gate; and
  (e) an output filter, comprising said first inductor electrically connected in series with said first triac and a third capacitor electrically connected in parallel with said first inductor and said first triac.

* * * * *